(12) United States Patent
Frank et al.

(10) Patent No.: US 8,314,983 B2
(45) Date of Patent: Nov. 20, 2012

(54) NONVOLATILE NANO-ELECTROMECHANICAL SYSTEM DEVICE

(75) Inventors: David J. Frank, Yorktown Heights, NY (US); Guy Cohen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 12/615,358

(22) Filed: Nov. 10, 2009

(65) Prior Publication Data

US 2011/0109952 A1 May 12, 2011

(51) Int. Cl.
*G02B 26/08* (2006.01)
(52) U.S. Cl. .................................................. 359/221.1
(58) Field of Classification Search ............... 359/221.1, 359/212, 1, 223
See application file for complete search history.

(56) References Cited

U.S. PATENT DOCUMENTS

| | | | |
|---|---|---|---|
| 7,511,532 B2 | 3/2009 | Derharcobian et al. | |
| 7,522,029 B1 * | 4/2009 | Lantz | 337/139 |
| 7,545,282 B2 | 6/2009 | Adamczyk et al. | |
| 2006/0198209 A1 | 9/2006 | Tran | |
| 2007/0121477 A1 | 5/2007 | Belov et al. | |
| 2008/0266930 A1 | 10/2008 | Auciello | |
| 2009/0129139 A1 | 5/2009 | Kam et al. | |

FOREIGN PATENT DOCUMENTS

WO WO2009128048 A1 10/2009
* cited by examiner

*Primary Examiner* — Euncha Cherry
(74) *Attorney, Agent, or Firm* — Cantor Colburn LLP; Vazken Alexanian

(57) ABSTRACT

A nonvolatile nano-electromechanical system device is provided and includes a cantilever structure, including a beam having an initial shape, which is supported at one end thereof by a supporting base and a beam deflector, including a phase change material (PCM), disposed on a portion of the beam in a non-slip condition with a material of the beam, the PCM taking one of an amorphous phase or a crystalline phase and deflecting the beam from the initial shape when taking the crystalline phase.

17 Claims, 9 Drawing Sheets up-down movement left-right movement rotational movement

NONVOLATILE NANO-ELECTROMECHANICAL SYSTEM DEVICE

BACKGROUND

Aspects of the present invention are directed to a nonvolatile nano-electromechanical system (NEMS).

Typically, nano-electromechanical system (NEMS) devices require power to perform a switching operation and, once power is turned-off, the devices will typically relax to their power-off state. As a result, even during standby conditions, a NEMS based system requires power to maintain its switching status.

During a lifetime of a given system employing NEMS devices, a major power demand arises out of the device's continuing need for power to maintain switching status regardless of whether switching between states in the NEMS devices is actually occurring. Moreover, a sudden and/or unexpected loss of power could result in a corresponding loss of data if the NEMS devices are left to relax to their power-off states.

SUMMARY

In accordance with an aspect of the invention, a nonvolatile nano-electromechanical system device is provided and includes a cantilever structure, including a beam supported at one end thereof by a supporting base and a beam deflector, including a phase change material (PCM), disposed on a portion of the beam in a non-slip condition with a material of the beam, the PCM taking one of an amorphous phase or a crystalline phase and deflecting the beam from an initial shape thereof when taking the crystalline phase In accordance with another aspect of the invention, a system is provided and includes a plurality of nonvolatile nano-electromechanical system devices, each device including a cantilever structure, including a beam supported at one end thereof by a supporting base, and a beam deflector, including a phase change material (PCM), disposed on a portion of the beam in a non-slip condition with a material of the beam, the PCM taking one of an amorphous phase or a crystalline phase and deflecting the beam from an initial shape thereof when taking the crystalline phase, and a controller coupled to each of the beam deflectors to selectively control the PCM of each to take the one of the amorphous or the crystalline phase.

In accordance with another aspect of the invention, a method of operating a plurality of nonvolatile nano-electromechanical system devices, each comprising a beam and a phase change material (PCM) disposed thereon in a non-slip condition, the PCM taking one of an amorphous or a crystalline phase and deflecting the beam when taking the crystalline phase, is provided. The method includes disconnecting the devices from a power source, receiving a signal indicating that a portion of the devices require phase updates, supplying power and, with the power supplied, controlling the PCMs requiring phase updates to take a new one of the amorphous or the crystalline phase and repeating the disconnecting of the devices from the power source.

In accordance with another aspect of the invention, a method of forming a nonvolatile nano-electromechanical system device is provided and includes depositing phase change material (PCM) onto a film in a non-slip condition, patterning the PCM into a beam deflector and the film into a beam and undercutting material to form the beam into a cantilever structure with the beam deflector configured to deflect the beam based on a PCM phase.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 1:
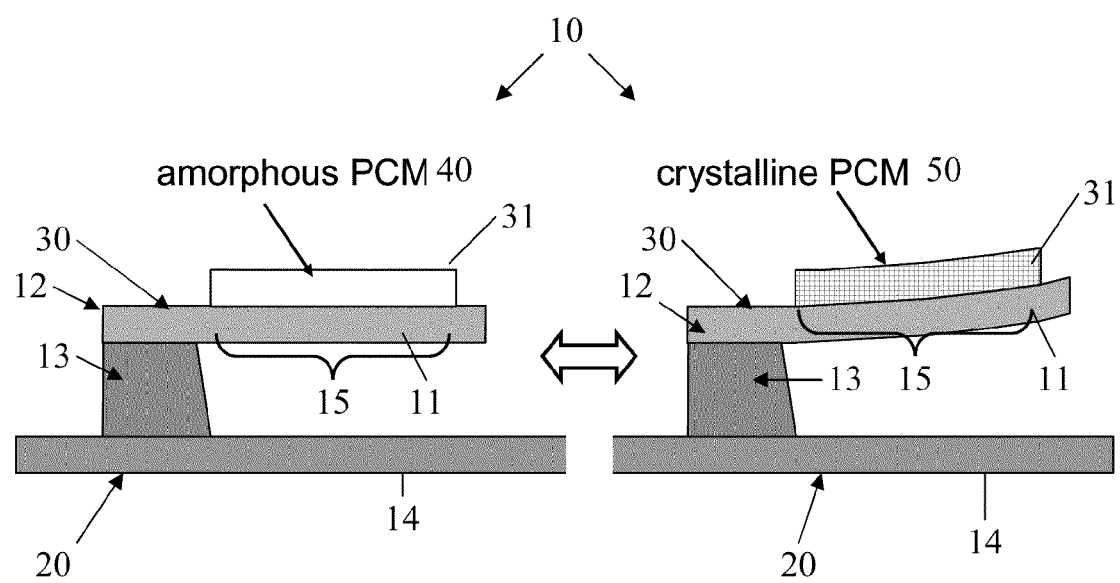
FIG. 1 is a side sectional view of a nonvolatile nano-electromechanical device in accordance with embodiments of the invention.

With reference to FIG. 1, a nonvolatile nano-electromechanical system (NEMS) device 10 is provided. The device 10 includes a cantilever structure 20 and a beam deflector 30. The cantilever structure 20 includes a beam 11 having an initial shape, which is supported at one end 12 thereof by a supporting base 13 disposed on a substrate 14. The beam deflector 30 includes a phase change material (PCM) 31 and is disposed on a portion 15 of the beam 11 in a non-slip condition with a material of the beam 11. The PCM 31 may take one of an amorphous phase 40 or a crystalline phase 50 and deflects the beam 11 from the initial shape when it takes the crystalline phase 50.

A material of the supporting base 13 and the substrate 14 may include crystalline materials, such as silicon, poly-crystalline materials, such as poly-silicon, amorphous materials, such as silicon dioxide, ceramics and organic materials, such as plastic or other similar materials. A material of the beam 11 may include silicon nitride, poly-silicon or other similar materials. The PCM 31 may include Germanium-Antimony-Tellurium (GST), such as $Ge_2Sb_2Te_5$, $Ge_4Sb_1Te_5$, AgInSbTe, etc., or other similar materials. As such, the PCM 31 and the beam 11 material may naturally adhere to one another. Where the PCM 31 and the beam 11 material do not naturally adhere to one another, adhesive may be applied between the PCM 31 and the beam 11 material.

Depending on a material of the PCM 31, the PCM 31 may exhibit about a 4-9% volume change upon crystallization from the amorphous phase 40 although this is merely exemplary and is by no means intended to be a limiting range. The volume change and the non-slip condition between the PCM 31 and the beam 11 material leads to the deflection of the beam 11. In an embodiment, as shown in FIG. 1, with the PCM 31 being in the amorphous phase 40, the beam 11 is substantially straight and flat in the initial shape and is oriented substantially in parallel with a face of the substrate 14. Here, if the beam deflector 30 and the PCM 31 are disposed on a face of the beam 11 facing away from the substrate 14, the PCM 31 causes the beam 11 to deflect away from the substrate 14 when the PCM 31 takes the crystalline phase 50.

Figure 2:
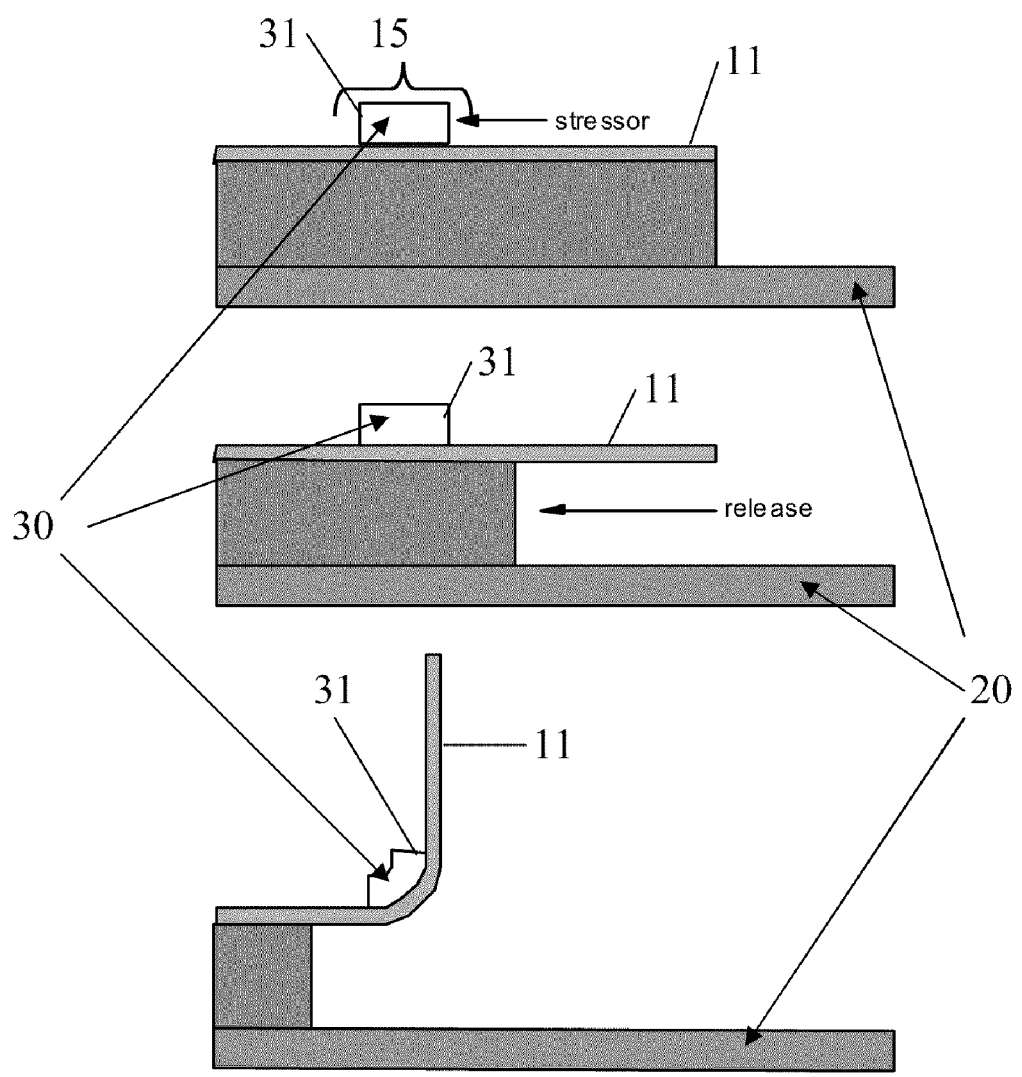
FIG. 2 is a schematic view of the device of FIG. 1
Figure 3:
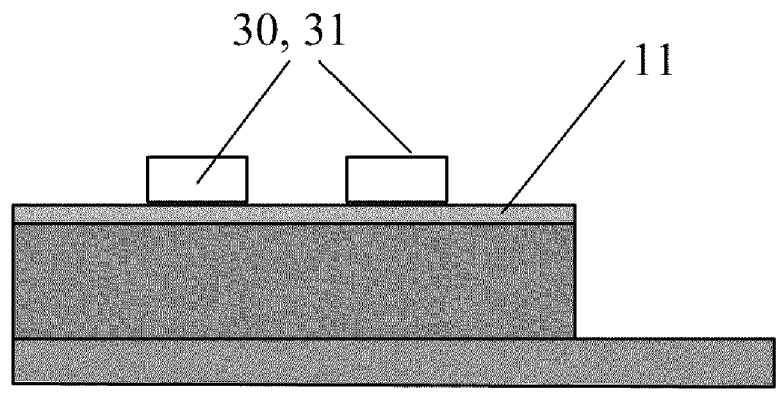
FIG. 3 is a schematic view of the device of FIG. 1 in accordance with further embodiments of the invention.
Figure 3:
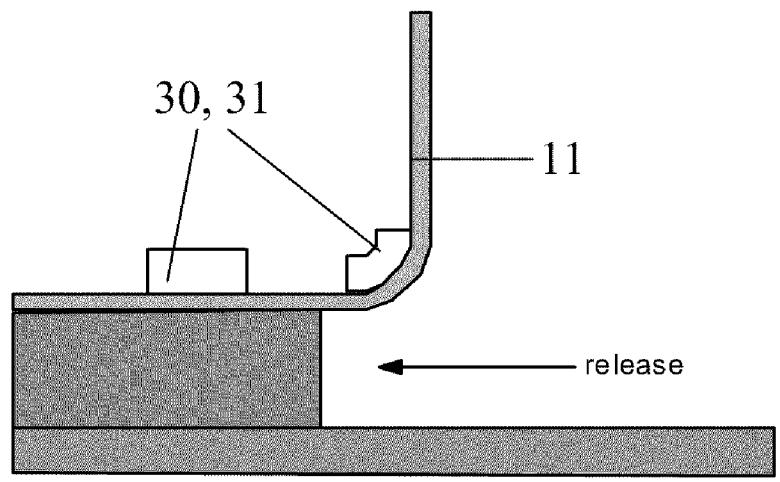
Figure 3:
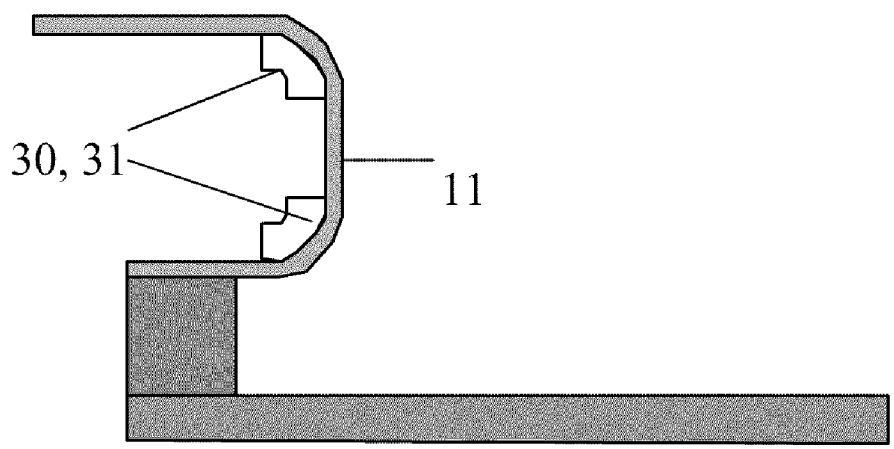

With reference to FIGS. 2 and 3, the beam deflector 30 may be a single component or may be plural in number. As shown in FIG. 2, with the beam deflector 30 and PCM 31 being a single component, the beam 11 is deflected at a single portion 15 thereof. Conversely, as shown in FIG. 3, the beam 11 can be deflected as many times as there are beam deflectors 30 and PCM 31 disposed thereon. Thus, it is possible to increase the shape, amount and orientation of deflection by using multiple beam deflectors 30. Further, it is possible to change the orientation of deflection by using multiple beam deflectors 30 at multiple faces and edges of the beam 11.

Still referring to FIGS. 2 and 3, it is noted that an assembly process for the device 10 is shown herein. In accordance with the assembly process, PCM 31 is deposited onto a film with the PCM 31 subsequently patterned into the beam deflector 30 or, in some cases, a plurality of beam deflectors 30 and the film subsequently patterned into the beam 11 of the cantilever structure 20. The cantilever structure 20 is then released by an undercutting of the material interposed between the beam 11 and a substrate (see, for example, the "release" term in FIGS. 2 and 3) along a length of the beam 11 that extends at least to a location of the beam deflector 30.

Figure 4A:
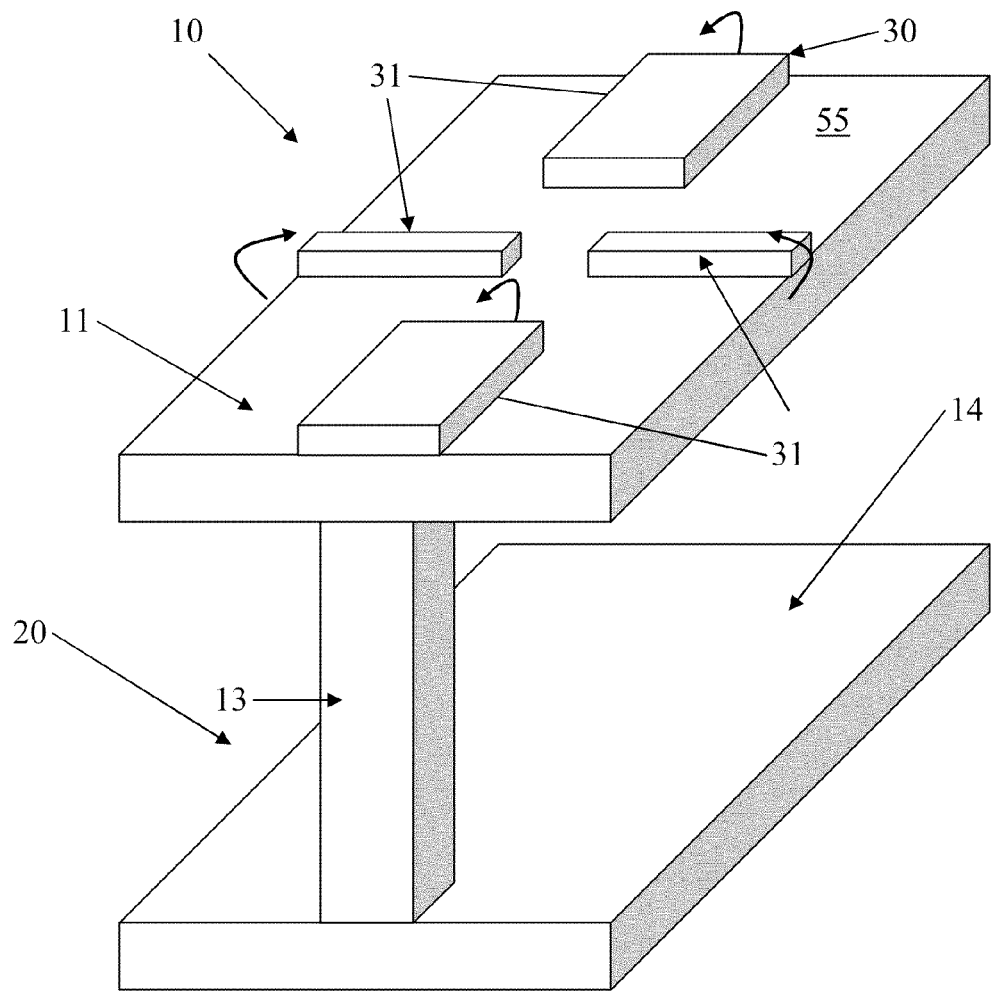
FIGS. 4A, 4B, 4C and 4D are schematic views of the device of FIG. 1 in accordance with further embodiments of the invention.

For example, as shown in FIG. 4A, the beam 11 may have a face 55 on which multiple beam deflectors 30 are positioned at various locations with various orientations. Here, it is seen that by independently crystallizing the PCM 31 of each beam deflector 30, it will be possible to deflect the beam 11 in multiple directions and orientations. This analog-type control can be useful in applications of the devices 10 in, for example, ultra-low power reflective displays and programmable lithography masks, where the freedom of analog-type control allows for customized device 10 control.

Figure 4B:
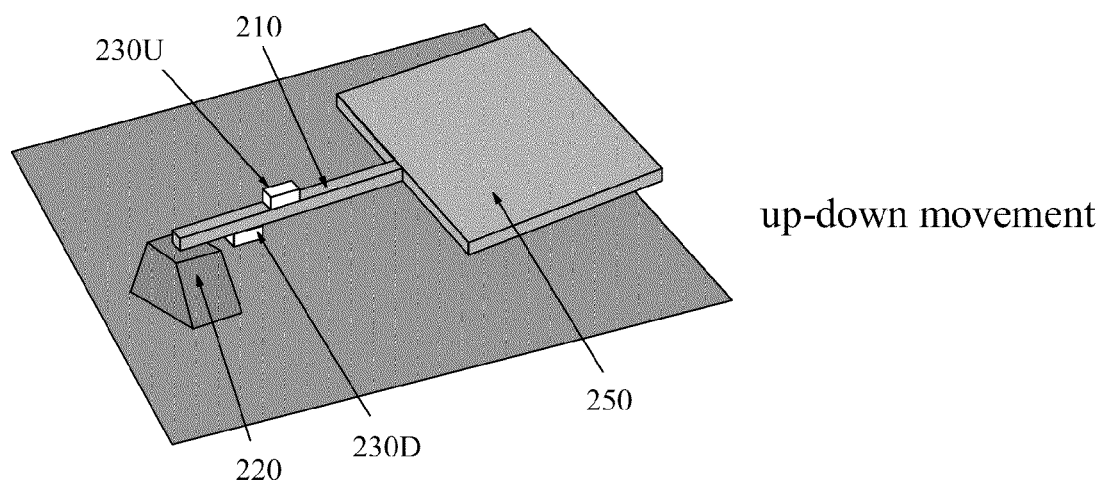
Figure 4C:
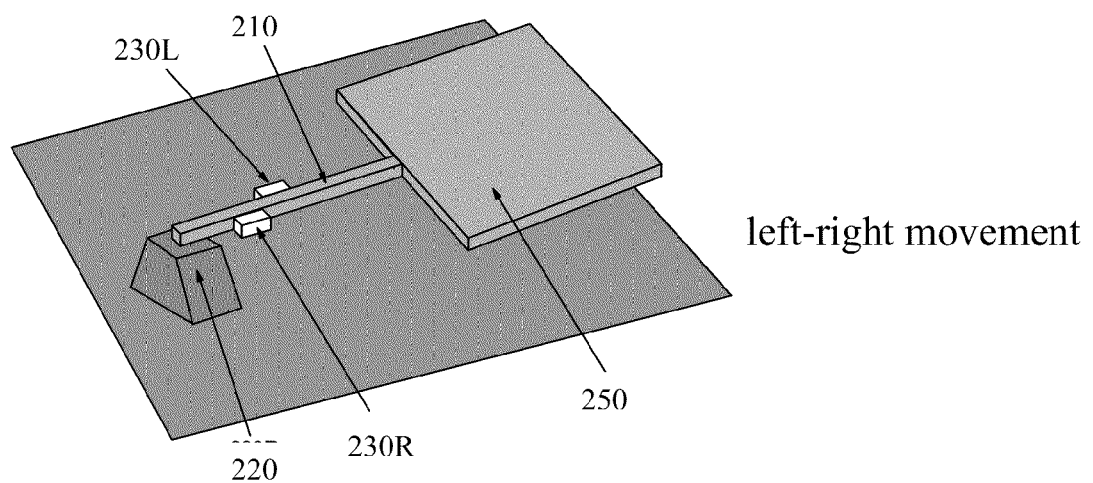

As shown in the further examples of FIGS. 4B and 4C and, in accordance with aspects of the invention, plate 250 and beam 210 combinations supported on a supporting base 220 can be made to deflect in alternating directions. That is, with PCM 230U and 230D positioned on opposite upward and downward surfaces of the beam 210, the plate 250 and beam 210 combination can be made to deflect in both the upward and downward directions. Similarly, with PCM 230L and 230R positioned on opposite left and right facing surfaces of the beam 210, the plate 250 and beam 210 combination can be made to deflect in left and right or lateral directions.

Figure 4D:
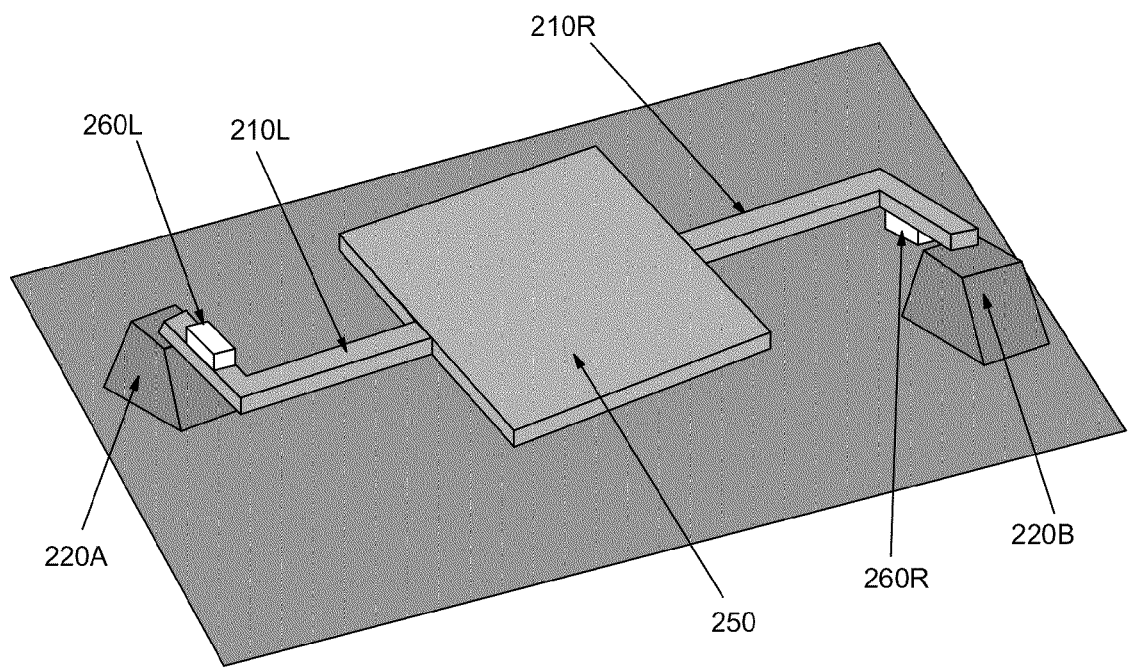

As shown in FIG. 4D, a plate 250 can be made to rotate. Here, beams 210L and 210R couple plate 250 with supporting bases 220A and 220B and have PCM 260L and 260R disposed on opposing faces, respectively. In operation, as PCM 260L and 260R become crystallized and amorphous, beams 210L and 210R deflect and the plate 250 rotates accordingly.

Figure 5:
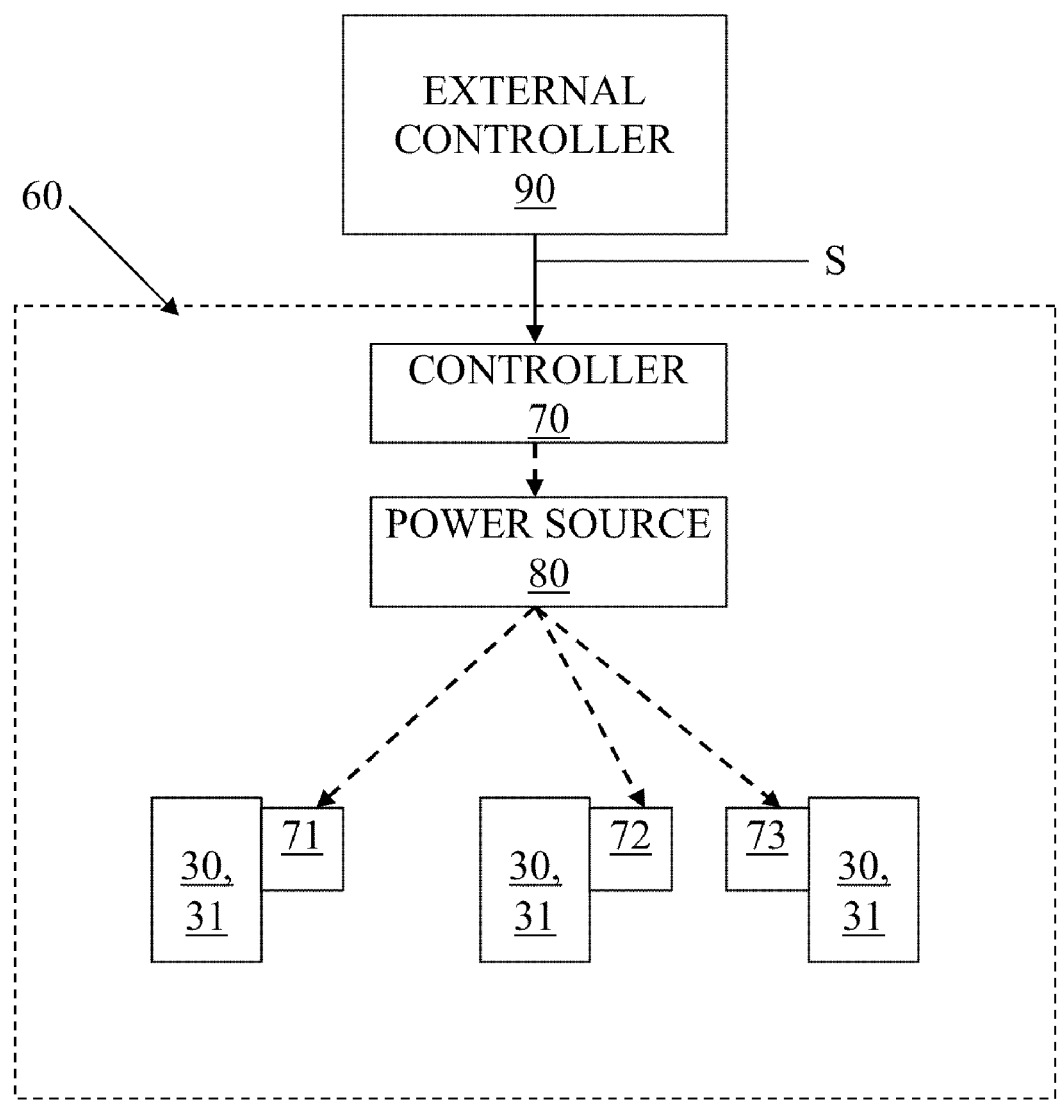
FIG. 5 is a schematic diagram of a controller of the device of FIG. 1.

With reference to FIG. 5, a system 60 is provided and includes the device 10, as described above, as well as a controller 70, which is coupled to one or more beam deflectors 30 and thereby configured to selectively control the PCM 31 of each to take the amorphous phase 40 or the crystalline phase 50. The system 60 may include a power source 80 to provide the system's only power when each PCM 31 changes phase and an external controller 90 disposed in signal communication with the controller 70 to issue a signal S to the controller 70 that indicates whether the beam 11 associated with any of the beam deflectors 30 is or is not to be deflected. The controller 70 is configured to receive the signal S and to respond accordingly. The controller 70 and the external controller 90 may be distinct from one another or integrally coupled and can be embodied as computing devices responding to executable instructions stored thereon.

The PCM 31 can be made to take the amorphous phase 40 or the crystalline phase 50 in various ways. As an example, the PCM 31 can be heated to a predefined temperature that is based on the composition of the PCM 31 and then cooled at a first relatively fast rate by, for example, a melt-quench process or some other similar processes to thereby induce the PCM 31 to take the amorphous phase 40 or at a second relatively slow rate to thereby induce the PCM 31 to take the crystalline phase 50.

As shown in FIG. 5, the controller 70 may include at least one of a circuit 71, a resistive heater 72 and a laser 73. The circuit 71 is electrically coupled to the PCM 31 and thereby configured to pass current through the PCM 31. The resistive heater 72 may be disposed in close proximity to the PCM 31 and may be configured to locally heat the PCM 31 without adversely heating surrounding components. The laser 73, such as an optical laser, may emit a laser beam toward the PCM 31 having sufficient intensity to heat the PCM 31. In any case, the controller 70 can either shut the circuit 71/resistive heater 72/laser 73 off completely and immediately to thereby cool the PCM 31 quickly to induce the PCM 31 to take the amorphous phase 40 or gradually shut off these components to thereby cool the PCM 31 slowly to thereby induce the PCM 31 to take the crystalline phase 50.

However the controller 70 heats the PCM 31, it is understood that the heating will be localized at the PCM 31 or, more generally, the beam deflector 30. This can be beneficial for scaling and avoiding unintentional heating of adjacent PCM elements 31.

A PCM NEMS switch incorporating the device 10 as described above can be employed in complementary-metal-oxide-semiconductor (CMOS) technology since the materials used in the device 10 are compatible with those of CMOS technology and may have built in redundancies. For example, the PCM NEMS switch incorporating the device 10 may be both electrically and optically accessible for read and/or write operations. For example, when PCM 31 is amorphous it has a very high resistivity compared with the crystalline resistivity of PCM. It is therefore possible to read or sense the device 10 position (state) electrically by measuring the PCM 31 resistivity. Similarly the refractive index of amorphous PCM is substantially different than that of crystalline PCM. It is therefore possible to read optically the state of the device by measuring the refractive index of the PCM 31 material. We note that reading (or sensing) the device state is done with very low current or very low optical power so the PCM material phase is not modified by the read operation.

Figure 6:
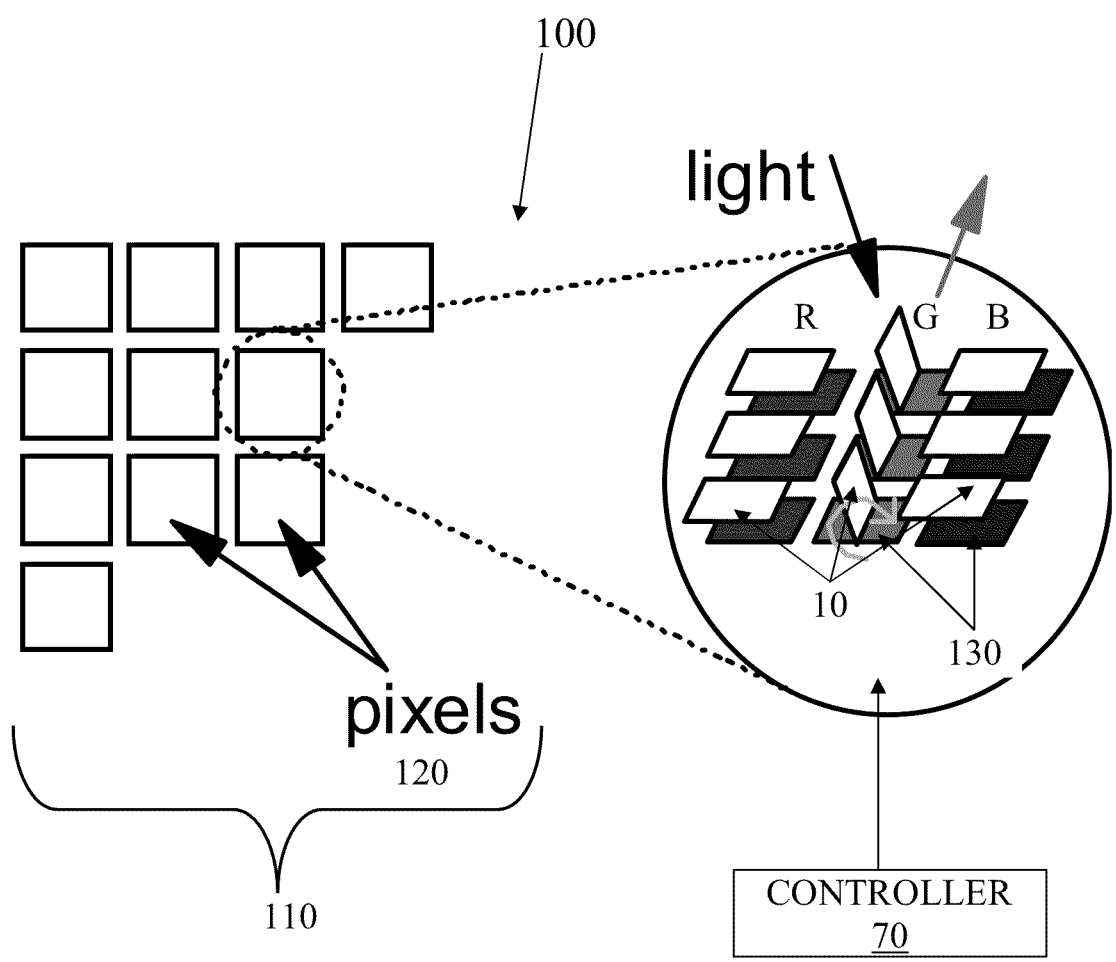
FIG. 6 is a schematic view of a system employing the device of FIG. 1.

With reference to FIG. 6, a system 100 is provided and includes a plurality of devices 10, as described above, and a controller 70 similar to the controller 70 described above. The system 100 could be employed for use with an ultra-low power reflective display 110 of, e.g., a computer monitor, a television or a portable device, such as an e-book or reader. The reflective display 110 uses external illumination similar to a conventional paper book. This is different than a conventional backlit display, such as a liquid crystal display (LCD), which normally includes a fluorescent lamp. In portable computers, such as notebooks, the LCD consumes about 30% of the system total power. Reflective displays are therefore much more power efficient.

Reflective display 110 further includes a plurality of pixels 120. Each pixel 120 includes an array of red-green-blue (RGB) dots 130. Each dot 130 can be individually masked by ones of the devices 10. Controller 70 can set the state of each of the dots 130 by changing the state of devices 10. In such a reflective display 110, individual dots 130 are visible if the PCM 31 of the corresponding devices 10 is made to take the crystalline phase 50 to thereby open the corresponding devices 10. The dots 130 are otherwise invisible when the PCM 31 of the corresponding devices 10 takes the amorphous phase 40 to close the devices 10. Here, it is understood that the beam 11 is opaque. Thus, in the example shown in FIG. 6, the pixel 120 reflects green since the devices 10 for the green dots are open and all other devices 10 are closed and opaque.

The intensity level of each color may be digitally controlled by the controller 70 with the controller 70 opening and closing a proportionate number of devices 10 of certain colors of certain pixels in accordance with a desired image. The controller 70 may also perform analog control by varying the rotation angle of the opening of the devices 10.

Since the devices 10 are nonvolatile, there is no need to power the display unless an update is required. Even in the extreme case of watching a movie, where the screen is updated about 30 times per second, the device 10 write-time may only be a few microseconds. So, for most of the time between updates all screen electronics can be turned off. Moreover, during normal operations, it is possible that only small regions of a display will need updates. The devices 10 therefore allow for smart updates in which power is provided only for updates to affected devices 10 at any particular time.

Over a display lifetime, assuming a continuous update rate of the screen at 30 times per second for 10 years, about $9\times10^9$ switches will be required and is a reasonable requirement for PCM material and NEMS devices 10. The required power for switching 15×15 nanometers (nm) of GST is about 1.5 picojoules (pJ), such that, assuming 1 million (M) pixels with all switching 30 times/s (extreme case), PCM volume of 25×100 nm gives a power consumption of about 0.5 milliwatts (mW). In accordance with an aspect of the invention, it is understood that portable devices, in particular, need to minimize display power to maintain long battery life and that, while a reduction in power is possible by way of the use of a reflective display, a further reduction in power is possible if the reflective display made use of the devices 10 and was, therefore nonvolatile with the battery being disconnected or otherwise unused except during page updates.

Figure 7:
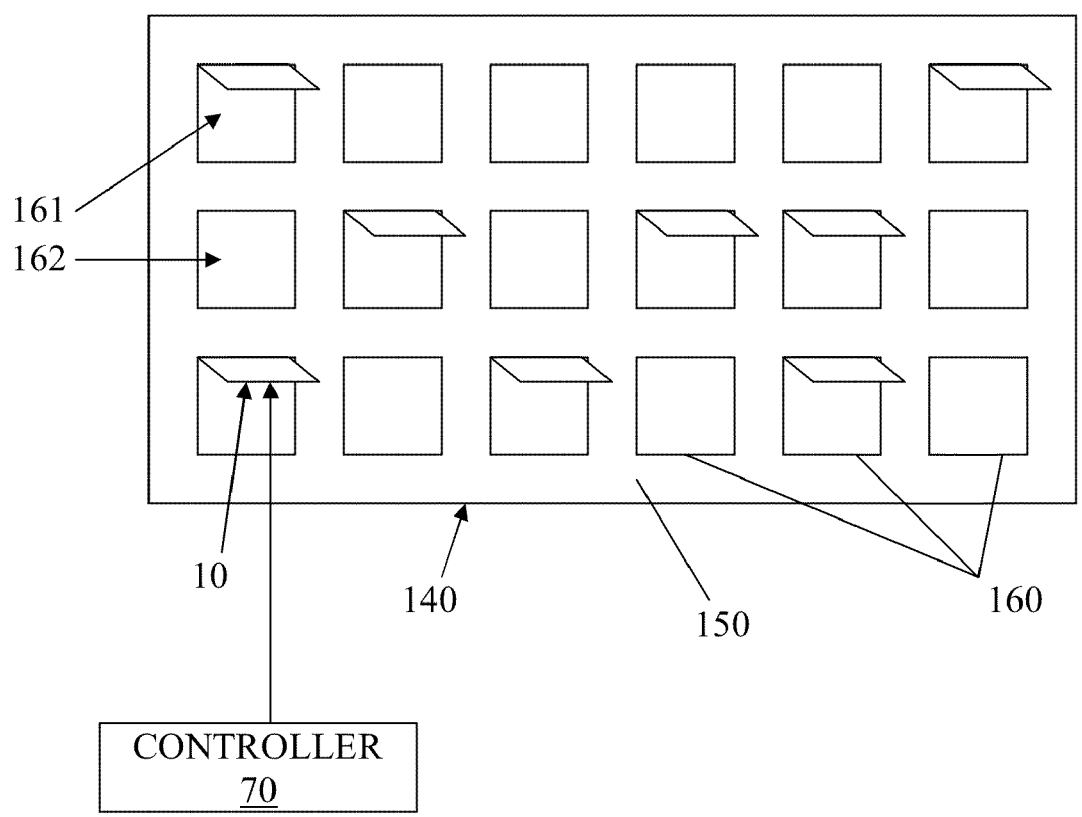
FIG. 7 is a schematic view of another system employing the device of FIG. 1

With reference to FIG. 7, the devices 10 may also be incorporated into a programmable stepper mask 140 for lithography. Such a mask 140 would include a mask substrate 150 having through-holes 160 defined therein, which are opened 161 and closed 162 by a plurality of discrete ones of the devices 10 disposed therein. Here, again, each of the devices 10 is individually controlled by the controller 70 to effectively control a shape of the mask 140 for various applications. Such a programmable stepper mask could enable production of a small number of chips at reasonable costs and could be used with existing steppers where conventional masks are not powered.

In accordance with further aspects of the invention, a method of operating a system is provided. The system, as above, includes a plurality of nonvolatile nano-electromechanical devices, each of which includes a beam and a beam deflector, including a phase change material (PCM) disposed on the beam in a non-slip condition. The PCM takes one of an amorphous phase or a crystalline phase and deflects the beam when taking the crystalline phase. The method includes disconnecting the devices from a power source, receiving a signal indicating that a portion of the devices require phase updates, supplying power and, with the power supplied, controlling the PCM of the devices requiring phase updates to take the one of the amorphous or the crystalline phase not previously taken. The method finally includes repeating the disconnecting of the devices from the power source so as to limit an amount of power required by the system.

In accordance with embodiments, the supplying of the power may include supplying power to only the devices requiring phase updates so that a further reduction in power demand can be achieved. Also, the controlling may includes at least one of digital and analog control, as described above.

In accordance with further aspects of the invention, it is understood that the control algorithm for the controller 70 may be embodied as executable instructions in a computer readable medium stored in a memory unit of a computing device. When executed, these instructions cause a processing unit of the computing device to instruct the controller 70 to operate as described above.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A nonvolatile nano-electromechanical system device, comprising:
   a cantilever structure, including a beam supported at one end thereof by a supporting base; and
   a beam deflector, including a phase change material (PCM), the PCM being adhesively disposed on a portion of the beam in a non-slip condition with a material of the beam and being configured to take one of an amorphous phase or a crystalline phase and to deflecting the beam from an initial shape thereof when taking the crystalline phase.

2. The device according to claim 1, wherein the beam comprises silicon nitride and the PCM comprises Germanium-Antimony-Tellurium (GST).

3. The device according to claim 1, further comprising a substrate on which the supporting base is disposed, the beam being substantially parallel with a face of the substrate with the PCM taking the amorphous phase.

4. The device according to claim 3, wherein the PCM is adhesively disposed on a face of the beam facing away from the substrate, the PCM being configured to deflect the beam away from the substrate when taking the crystalline phase.

5. The device according to claim 1, wherein the PCM exhibits a 4-9% volume change upon crystallization from the amorphous phase.

6. A nonvolatile nano-electromechanical system device, comprising:
   a cantilever structure, including a beam supported at one end thereof by a supporting base; and
   a beam deflector, including a phase change material (PCM), disposed on a portion of the beam in a non-slip condition with a material of the beam, the PCM taking one of an amorphous phase or a crystalline phase and deflecting the beam from an initial shape thereof when taking the crystalline phase,
   wherein the beam deflector is plural in number and is disposed at one or more portions of the beam.

7. A system, comprising the device according to claim 1 and a controller coupled to the beam deflector to control the PCM to take the one of the amorphous or the crystalline phase.

8. The system according to claim 7, further comprising a power source to provide power to the system only when a phase of the PCM changes.

9. The system according to claim 7, further comprising an external controller disposed in signal communication with the controller, the external controller signaling the controller as to whether the beam is to be deflected.

10. The system according to claim 7, wherein the controller is configured to melt the PCM at first and second rates to induce the PCM to take the amorphous or the crystalline phase, respectively.

11. The system according to claim 7, wherein the controller comprises at least one of a circuit configured to pass current through the PCM, a resistive heater and a laser.

12. The system according to claim 7, wherein a deflection of the beam is resistively and optically readable.

13. A system, comprising:
a plurality of nonvolatile nano-electromechanical system devices, each device comprising:
a cantilever structure, including a beam supported at one end thereof by a supporting base, and
a beam deflector, including a phase change material (PCM), the PCM being adhesively disposed on a portion of the beam in a non-slip condition with a material of the beam and being configured to take one of an amorphous phase or a crystalline phase and to deflect the beam from an initial shape thereof when taking the crystalline phase; and
a controller coupled to each of the beam deflectors to selectively control the PCM of each to take the one of the amorphous or the crystalline phase.

14. A reflective display comprising:
a plurality of pixels including an array of red-green-blue (RGB) dots; and
a plurality of nonvolatile nano-electromechanical system devices, each device comprising a cantilever structure, including a beam supported at one end thereof by a supporting base, and a beam deflector, including a phase change material (PCM), disposed on a portion of the beam in a non-slip condition with a material of the beam, the PCM taking one of an amorphous phase or a crystalline phase and deflecting the beam from an initial shape thereof when taking the crystalline phase; and
a controller coupled to each of the beam deflectors to selectively control the PCM of each to take the one of the amorphous or the crystalline phase,
wherein discrete ones of the devices are individually controlled by the controller.

15. The reflective display according to claim 14, wherein the discrete ones of the devices are controlled digitally or analogically.

16. The reflective display according to claim 14, wherein the discrete ones of the devices only draw power during a change in phase of the PCM.

17. A programmable stepper mask for lithography comprising:
a plurality of nonvolatile nano-electromechanical system devices, each device comprising a cantilever structure, including a beam supported at one end thereof by a supporting base, and a beam deflector, including a phase change material (PCM), disposed on a portion of the beam in a non-slip condition with a material of the beam, the PCM taking one of an amorphous phase or a crystalline phase and deflecting the beam from an initial shape thereof when taking the crystalline phase; and
a controller coupled to each of the beam deflectors to individually control each of the plurality of the devices by selectively controlling the PCM of each to take the one of the amorphous or the crystalline phase.

* * * * *